US 8,040,159 B1

(12) United States Patent
Lall

(10) Patent No.: US 8,040,159 B1
(45) Date of Patent: Oct. 18, 2011

(54) COMPARATOR WITH JITTER MITIGATION

(75) Inventor: Ravindar Mohan Lall, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 12/729,952

(22) Filed: Mar. 23, 2010

(51) Int. Cl.
*H03K 5/22* (2006.01)
(52) U.S. Cl. ......................................... 327/65
(58) Field of Classification Search ............ 327/65
See application file for complete search history.

(56) References Cited

U.S. PATENT DOCUMENTS

| | | | | |
|---|---|---|---|---|
| 5,883,539 | A * | 3/1999 | Kimura | 327/359 |
| 6,229,350 | B1 * | 5/2001 | Ricon-Mora | 327/77 |
| 6,535,029 | B2 | 3/2003 | Shih et al. | |
| 6,801,059 | B2 * | 10/2004 | Lee | 327/65 |
| 7,183,812 | B2 * | 2/2007 | Nairn | 327/63 |
| 7,463,060 | B1 * | 12/2008 | Whitten et al. | 326/40 |
| 7,498,851 | B2 * | 3/2009 | Maone | 327/65 |
| 7,595,676 | B2 * | 9/2009 | Trifonov | 327/206 |
| 7,902,894 | B2 * | 3/2011 | Mohtashemi | 327/205 |
| 7,911,237 | B2 * | 3/2011 | Maone | 327/77 |

OTHER PUBLICATIONS

Allen et al., CMOS Analog Circuit Design, 1987, pp. 349-354, 356.
Tyhack et al., IEEE Journal of Solid-State Circuits, A 90-nm FPGA I/O Buffer Design With 1.6-Gb/s Data Rate for Source-Synchronous System and 300-MHz Clock Rate for External Memory Interface, vol. 40, No. 9, Sep. 2005, pp. 1829-1838.

* cited by examiner

*Primary Examiner* — Lincoln Donovan
*Assistant Examiner* — William Hernandez
(74) *Attorney, Agent, or Firm* — Haynes and Boone, LLP

(57) ABSTRACT

In one example, a comparator circuit includes a differential stage adapted to receive a differential input signal. The comparator circuit includes first and second diodes coupled to the differential stage. The first and second diodes are adapted to selectively switch on and off to provide a differential output signal at first and second differential output nodes in response to the differential input signal. The comparator circuit includes a current steering circuit adapted to selectively provide a reference current from a current source to the first or second diode in an off state to reduce a voltage swing of the first or second diode between the off state and an on state. The comparator circuit includes an output stage coupled to the first and second diodes at the first and second differential output nodes. The output stage is adapted to convert the differential output signal to a single ended output signal.

20 Claims, 7 Drawing Sheets

COMPARATOR WITH JITTER MITIGATION

TECHNICAL FIELD

The invention relates generally to electrical circuits and, more particularly, to comparators.

BACKGROUND

Conventional high speed comparators typically receive a differential input signal at a differential pair of transistors biased by a reference current (e.g., a tail current). In response to the differential input signal, the transistors selectively pass the tail current to one or the other of a pair of diodes. The diode receiving the tail current turns on and the remaining diode turns off. The resulting voltages at the diodes typically feed a gain stage that provides a single ended output signal.

If the differential input signal does not rapidly change, the voltage at the diode in the off state may slowly decay to a very low voltage level well below the threshold voltage of the diode. As a result, if the comparator attempts to switch on the diode (e.g., in response to a change in the differential input signal), the diode voltage may be required to swing from a very low voltage up to its threshold voltage. In contrast, if the differential input signal does rapidly change, the voltage of the diode in the off state may not decay far below its threshold voltage.

The different voltage swings of the diodes associated with different data patterns in the differential input signal may cause conventional comparators to exhibit varying data propagation delays which appear as data dependent jitter (e.g., duty cycle distortion) in the single ended output signal. Such jitter is particularly problematic for high speed comparators. As a result, there is a need for an improved approach to comparator design that reduces data dependent jitter associated with conventional comparators.

SUMMARY

In accordance with one embodiment of the invention, a comparator circuit includes a differential stage adapted to receive a differential input signal; first and second diodes coupled to the differential stage, wherein the first and second diodes are adapted to selectively switch on and off to provide a differential output signal at first and second differential output nodes in response to the differential input signal; a current steering circuit adapted to selectively provide a reference current from a current source to the first or second diode in an off state to reduce a voltage swing of the first or second diode between the off state and an on state; and an output stage coupled to the first and second diodes at the first and second differential output nodes, wherein the output stage is adapted to convert the differential output signal to a single ended output signal.

In accordance with another embodiment of the invention, a method of operating a comparator circuit includes receiving a differential input signal at a differential stage; selectively switching on and off first and second diodes coupled to the differential stage to provide a differential output signal at first and second differential output nodes in response to the differential input signal; selectively providing a reference current to the first or second diode in an off state to reduce a voltage swing of the first or second diode between the off state and an on state; and converting the differential output signal to a single ended output signal using an output stage.

In accordance with another embodiment of the invention, a programmable logic device (PLD) includes a comparator circuit comprising: a differential stage adapted to receive a differential input signal; first and second diodes coupled to the differential stage, wherein the first and second diodes are adapted to selectively switch on and off to provide a differential output signal at first and second differential output nodes in response to the differential input signal; a current steering circuit adapted to selectively provide a reference current from a current source to the first or second diode in an off state to reduce a voltage swing of the first or second diode between the off state and an on state; and an output stage coupled to the first and second diodes at the first and second differential output nodes, wherein the output stage is adapted to convert the differential output signal to a single ended output signal.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1:
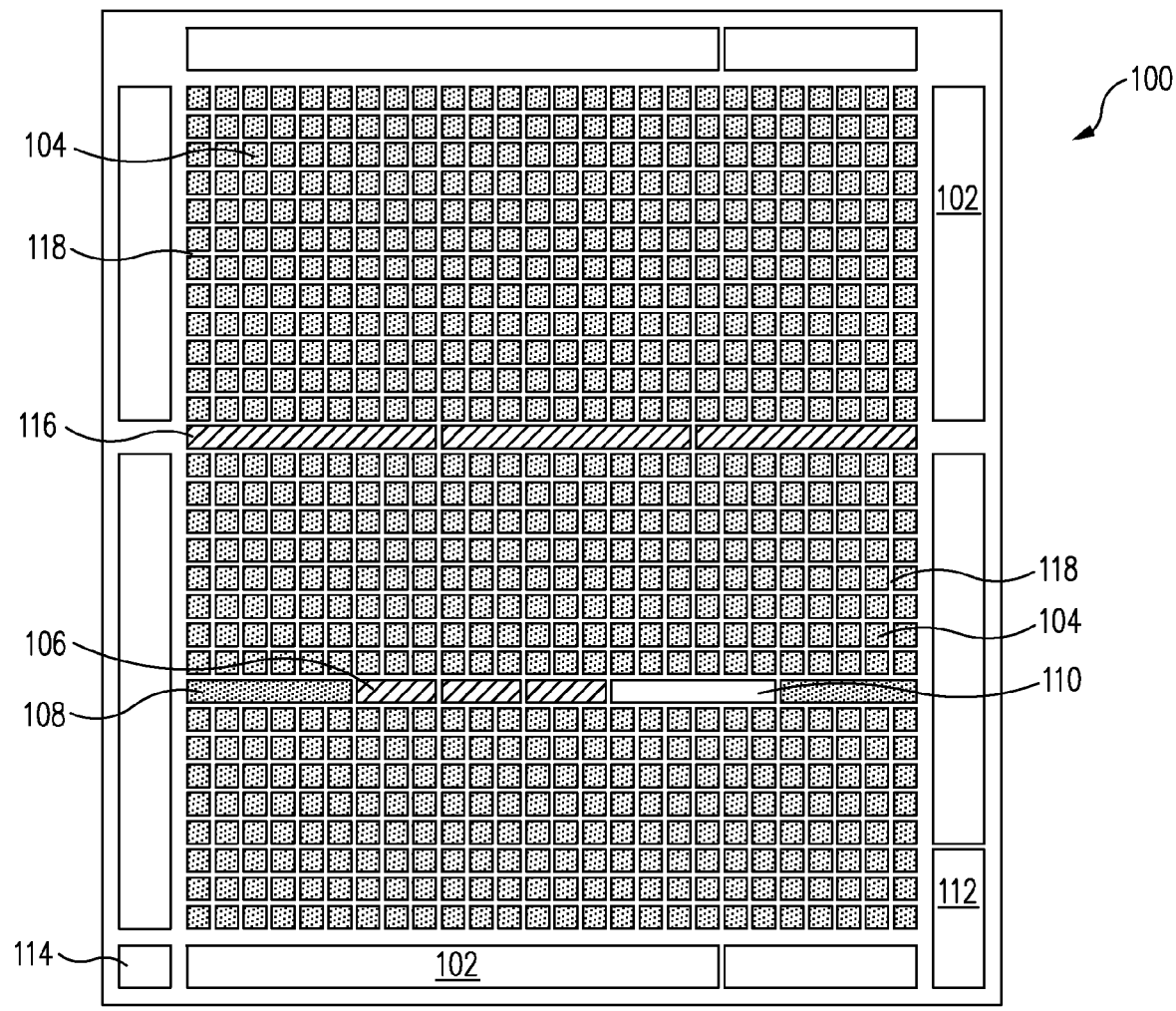
FIG. 1 illustrates a block diagram of a programmable logic device (PLD) in accordance with an embodiment of the invention.
Figure 2A:
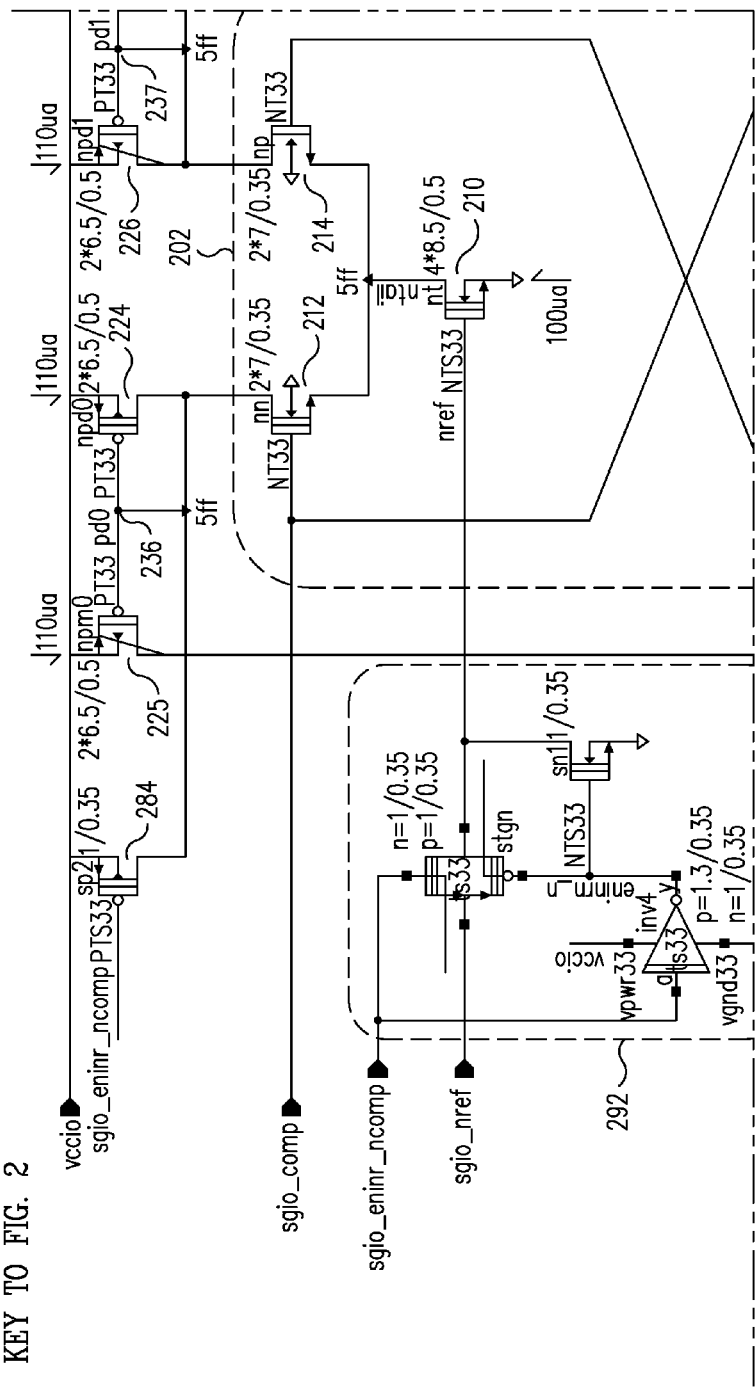
FIG. 2 illustrates an exemplary circuit implementation of a comparator in accordance with an embodiment of the invention.
Figure 2B:
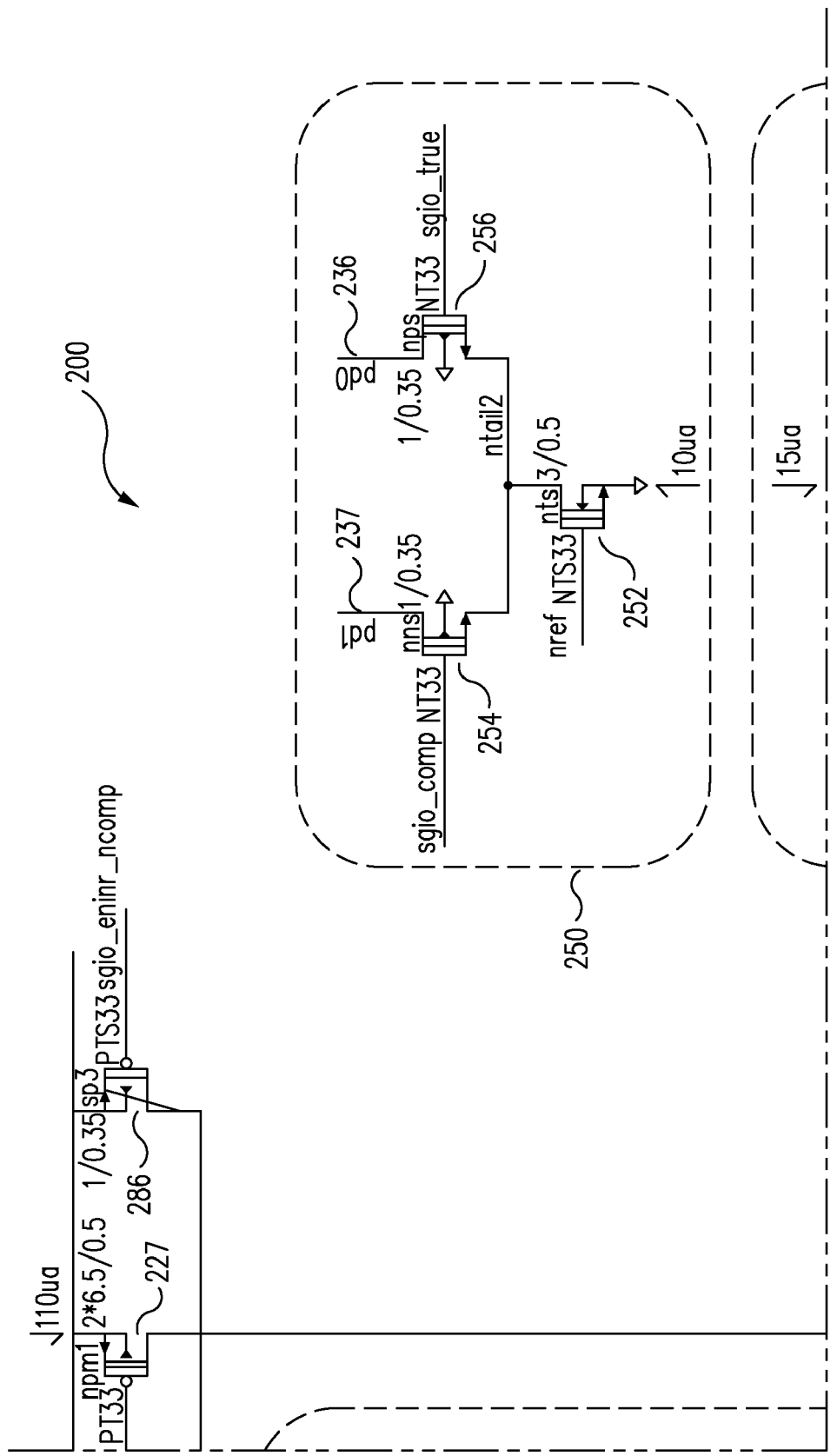
Figure 2C:
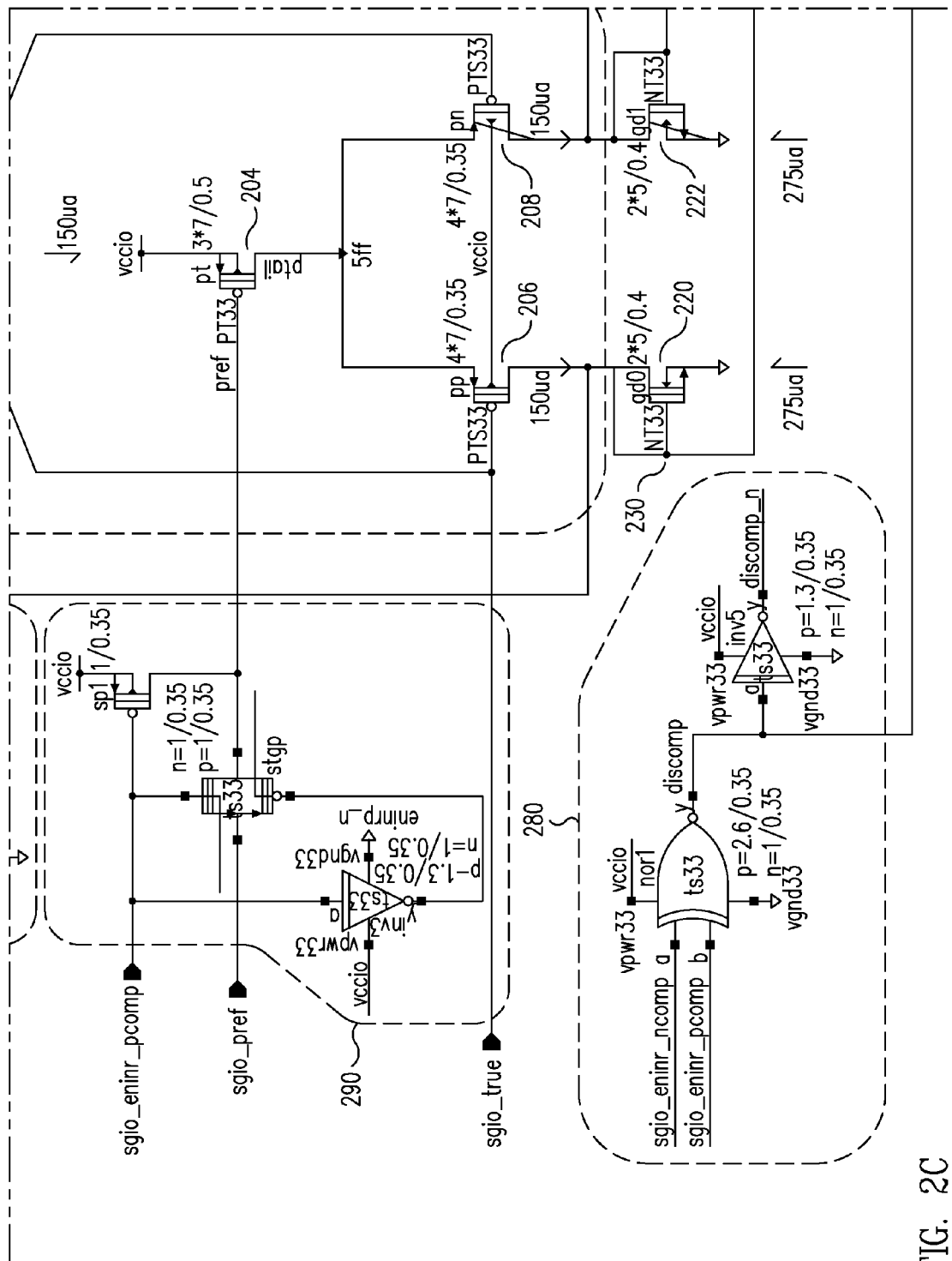
Figure 2D:
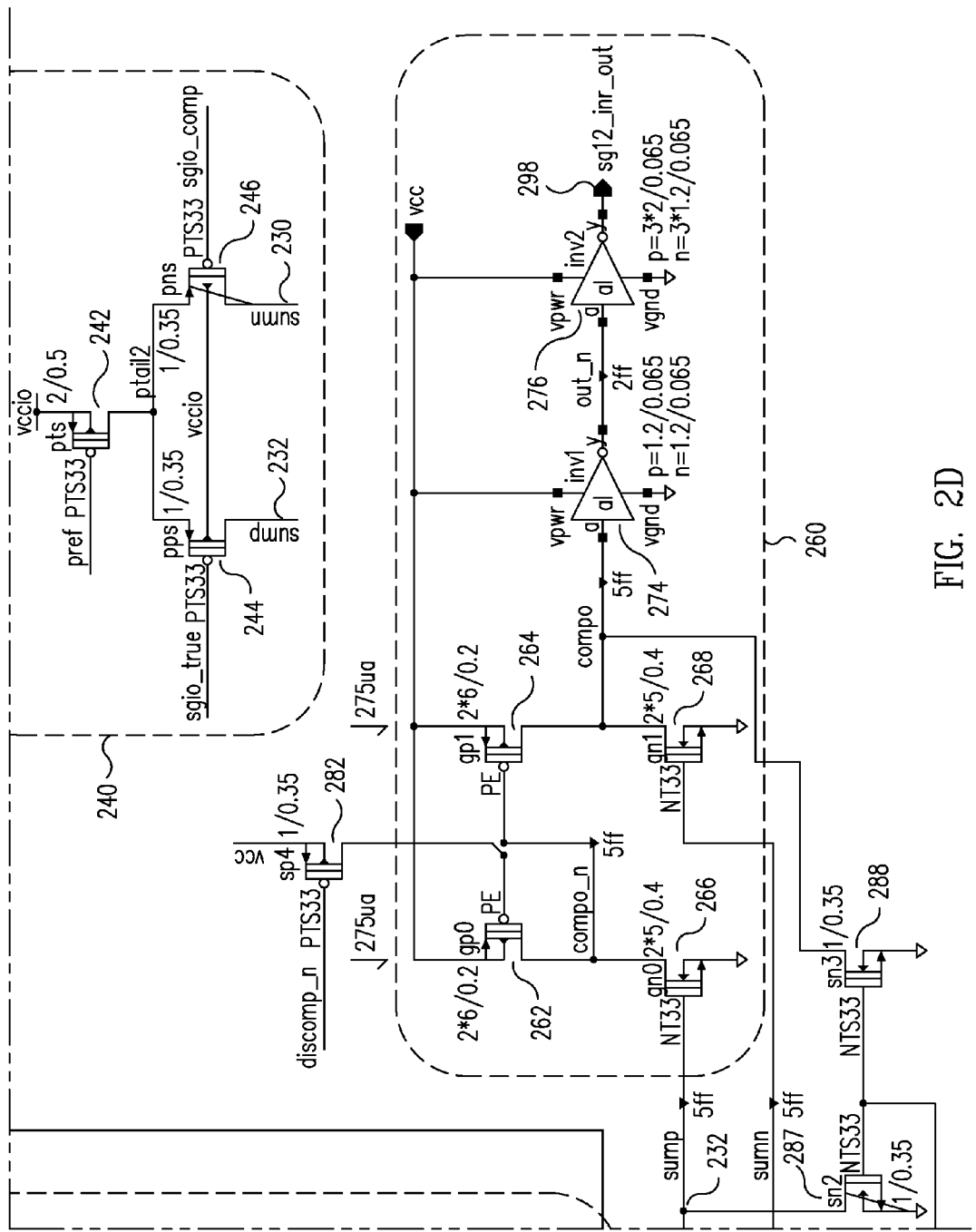

FIG. 1 illustrates a block diagram of a programmable logic device (PLD) 100 in accordance with an embodiment of the invention. In various embodiments, PLD 100 may be implemented as a PLD in the ECP2/M family or the XO2 family of devices available from Lattice Semiconductor Corporation of Hillsboro, Oreg.

PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., digital signal processing (DSP) blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements may not be required for a desired application or design specification (e.g., for the type of programmable device selected).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). It should also be understood that the various embodiments of the invention as disclosed herein are not limited to programmable logic devices, such as PLD 100, and may be applied to various other types of programmable devices, as would be understood by one skilled in the art.

FIG. 2 illustrates an exemplary circuit implementation of a comparator 200 in accordance with an embodiment of the invention. In one embodiment, comparator 200 may be implemented as a rail-to-rail input comparator. In one embodiment, comparator 200 may be implemented as part of a PLD, such as PLD 100 of FIG. 1. For example, in such an embodiment, comparator 200 may be implemented as part of I/O blocks 102, or any other part of PLD 100 where appropriate. In another embodiment, comparator 200 may be implemented as part of any other type of device as may be desired for use with a wide variety of circuits and applications.

Comparator 200 includes a differential stage 202, diodes 220, 222, 224, and 226, current steering circuits 240 and 250, an output stage 260, biasing circuits 290 and 292, and various other circuits further described herein.

Differential stage 202 may receive a differential input signal provided by complementary signals sgio_true and sgio_comp. For example, in one embodiment, signals sgio_true and sgio_comp may be received through one of I/O blocks 102 of PLD 100.

Differential stage 202 includes transistors 204 and 210, a differential pair of transistors 206 and 208, and a differential pair of transistors 212 and 214. Transistors 204 and 210 may be biased by biasing circuits 290 and 292 in response to reference voltage signals sgio_pref and sgio_nref. As a result, transistors 204 and 210 may operate as current sources to provide reference currents (e.g., also referred to as tail currents) of approximately 150 µA and approximately 100 µA to transistors 206/208 and 212/214 in one embodiment.

As shown in FIG. 2, diodes 220, 222, 224, and 226 (e.g., all implemented by connected transistor loads in this embodiment) are coupled to differential stage 202 at nodes 230, 232, 236, and 237, respectively. Comparator 200 also includes a transistor 225 coupled to diodes 220 and 224 at nodes 230 and 236, respectively. Comparator 200 also includes a transistor 227 coupled to diodes 222 and 226 at nodes 232 and 237, respectively.

Nodes 230 and 232 are differential output nodes and couple output stage 260 to diodes 220 and 222, respectively. Output stage 260 includes a gain circuit provided by transistors 262, 264, 266, and 268, and also includes inverters 274 and 276. Output stage 260 may convert a differential output signal provided by complementary signals sumn and sump at nodes 230 and 232 to a single ended output signal sg12_inr_out at a node 298.

As shown in FIG. 2, a first reference voltage labeled vccio (e.g., in the range of approximately 2.5 V to approximately 3.3 V in one embodiment) may be used to power portions of comparator 200, and a second reference voltage labeled vcc (e.g., approximately 1.2 V in one embodiment) may be used to power other portions of comparator 200. In particular, differential stage 202 may be powered by the first reference voltage, and output stage 260 may be powered by the second reference voltage. Accordingly, it will be appreciated that the gain circuit of output stage 260 may be used to convert the differential output signal using the first reference voltage to a single ended output signal using the second reference voltage.

Current steering circuits 240 and 250 are coupled to nodes 230/232 and 236/237, respectively. In this regard, although current steering circuits 240 and 250 are shown separately from other portions of comparator 200 for purposes of clarity, it will be appreciated that current steering circuits 240 and 250 are physically coupled to other portions of comparator 200 through such nodes.

Current steering circuit 240 includes a current source provided by transistor 242 and a differential pair of transistors 244 and 246. Current steering circuit 250 includes a current source provided by transistor 252 and a differential pair of transistors 254 and 256.

Comparator 200 also includes various disable circuitry provided by logic 280, transistors 282, 284, 286, 287, and 288, and associated connections which may be used to selectively turn off differential stage 202 and the gain circuit of output stage 260 in response to disable signals sgio_eninr_pcomp and sgio_eninr_ncomp. As a result, power consumption of comparator 200 may be reduced. In one embodiment, disable signals sgio_eninr_pcomp and sgio_eninr_ncomp may be provided by data bits stored in configuration memory 114.

In operation, comparator 200 receives complementary signals sgio_true and sgio_comp at the gates of transistors 206, 208, 212, and 214 of differential stage 202. Transistors 206 and 208 may selectively pass a reference current (e.g., approximately 150 µA in this example) from transistor 204 to either of nodes 230 or 232 in response to the differential input signal. Because signals sgio_true and sgio_comp of the differential input signal are complementary, the reference current is passed to only one of nodes 230 or 232. As a result, the voltage at one of nodes 230 or 232 not receiving the reference current will be permitted to drop (e.g., below a threshold voltage of diode 220 or 222) and the voltage at the other one of nodes 230 or 232 receiving the reference current will be pulled up (e.g., above a threshold voltage of diode 220 or 222). Thus, diodes 220 and 222 may be selectively turned on or off in response to the differential input signal (e.g., if the differential input signal exhibits a voltage swing in the range of approximately 100 mV to approximately 350 mV).

Similarly, transistors 212 and 214 may selectively pass a reference current (e.g., approximately 100 µA in this example) from transistor 210 to only one of nodes 230 or 232 in response to the differential input signal. As a result, the voltage at the one of nodes 236 or 237 not receiving the reference current will be permitted to drop (e.g., below a threshold voltage of diode 224 or 226) and the voltage at the other one of nodes 236 or 237 receiving the reference current will be pulled up (e.g., above a threshold voltage of diode 224 or 226). Thus, diodes 224 and 226 may be selectively turned on or off in response to the differential input signal.

The voltages at nodes 236 and 237 cause transistors 225 and 227 to selectively turn on or off. As a result, an additional reference current may be selectively provided to node 230 or 232 through transistor 225 or 227 in response to the differential input signal. Thus, node 230 or node 232 may receive a sum of two reference currents (e.g., a reference current selectively passed by transistors 206/208, and another reference current selectively passed by transistors 225/227 in response to the operation of transistors 212/214).

As a result of the reference currents selectively passed to either node 230 or node 232, diodes 220 and 222 may selectively switch on or off to provide a differential output signal by complementary signals sumn and sump at nodes 230 and 232. For example, diode 220 may be switched on (e.g., node 230 may have a voltage above the threshold voltage of diode 220) and diode 222 may be switched off (e.g., node 232 may have a voltage below the threshold voltage of diode 222). Alternatively, diode 220 may be switched off (e.g., node 230 may have a voltage below the threshold voltage of diode 220) and diode 222 may be switched on (e.g., node 232 may have a voltage above the threshold voltage of diode 222).

Current steering circuits 240 and 250 may be used to selectively provide additional reference currents (e.g., also referred to as bleed currents) to nodes 230, 232, 236, or 237 for any of diodes 220, 222, 224, or 226 that are switched off. For example, in current steering circuit 240, transistors 244 and 246 may selectively pass a reference current (e.g., approximately 15 µA in this example) from transistor 242 to either of diodes 220 or 222 through nodes 230 or 232 in response to the differential input signal. As another example, in current steering circuit 250, transistors 254 and 256 may selectively pass a reference current (e.g., approximately 10 µA in this example) from transistor 252 to either of diodes 224 or 226 through nodes 236 or 237 in response to the differential input signal.

Such reference currents may prevent the voltages at such nodes from falling substantially below the threshold voltages of the corresponding diodes when the diodes are off. As a result, the voltage swing between off and on states for the corresponding diodes may be reduced. Thus, the differential output signal provided by complementary signals sumn and sump at nodes 230 and 232 and the single ended output signal sg12_inr_out provided at node 298 may all exhibit less jitter in comparison to other approaches do not provide such additional reference currents. In particular, the use of such additional reference currents may prevent the diode voltages from falling to low values in cases where the differential input signal includes large numbers of sequential logic high (e.g., one) or logic low (e.g., zero) values.

By providing reference currents from current steering circuits 240 and 250 only to diodes that are off, significant power and device area savings may be realized. Regarding power, because the reference currents from current steering circuits 240 and 250 are not provided to diodes that are on, excess current is not wasted. Regarding size, the diodes need not be sized larger to accommodate the reference currents from current steering circuits 240 and 250 because such reference currents are only provided when the diodes are off (e.g., the off diodes are not simultaneously receiving additional reference currents through the operation of transistors 206/208 and 212/214).

Figure 3:
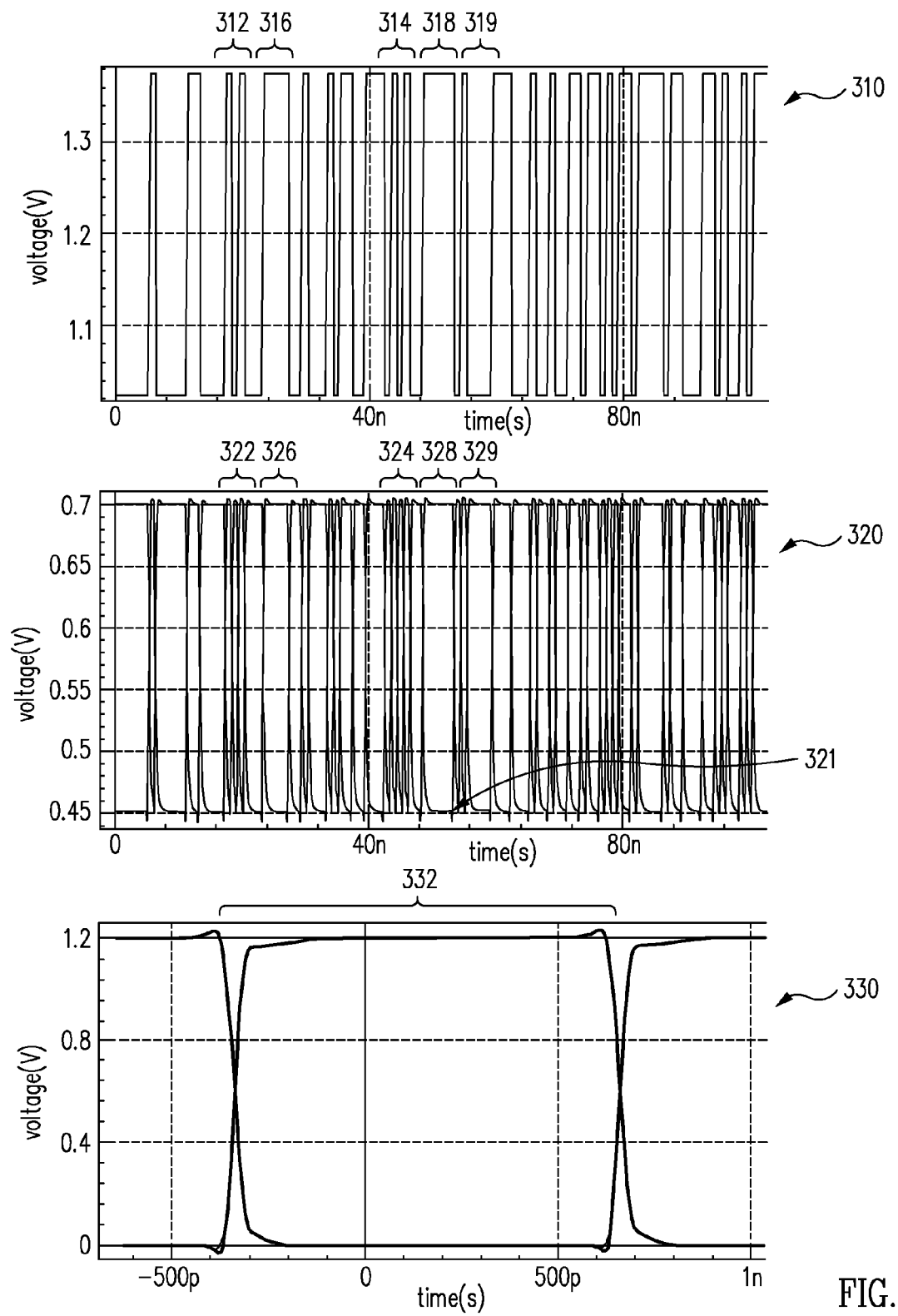
FIG. 3 illustrates signal plots associated with a comparator in accordance with an embodiment of the invention.

Features of comparator 200 may be further appreciated upon inspection of FIG. 3. FIG. 3 illustrates signal plots 310, 320, and 330, associated with comparator 200 in accordance with an embodiment of the invention.

Plot 310 illustrates the differential input signal provided by complementary signals sgio_true and sgio_comp. In the illustrated embodiment, the differential input signal provides a pseudorandom binary sequence (PRBS) operating at approximately 1 GBps. In portions of the PRBS, the differential input signal rapidly alternates between logic high and logic low values in accordance with several sequentially encoded data bits having alternating values (e.g., see portions 312 and 314). In other portions of the PRBS, the differential input signal remains at the same logic value in accordance with several sequentially encoded data bits having the same value (e.g., see portions 316, 318, and 319).

Plot 320 illustrates the resulting voltages at nodes 230 and 232 provided to diodes 220 and 222 by comparator 200 in response to the differential input signal of plot 310. As shown in plot 320, nodes 230 and 232 exhibit consistent voltages ranging from approximately 0.45 V to approximately 0.7 V. This is due to the operation of one or more of current steering circuits 240 and 250 providing a reference current (e.g., a bleed current) to one or more of diodes 220, 222, 224, and 226 which are turned off. In this regard, the additional reference current causes a minimum voltage (e.g., approximately 0.45 V in one embodiment) to be maintained at the diodes. As a result, the voltage swing of the diodes when transitioning from an "off" state to an "on" state may be kept to a relatively narrow range during the operation of comparator 200.

Advantageously, this narrow range is maintained when the differential input signal rapidly alternates between logic high and logic low values (e.g., see portions 322 and 324), and is further maintained when the differential input signal remains at the same logic value (e.g., see portions 326, 328, and 329). As indicated in FIG. 3, an arrow 321 identifies that the voltage at nodes 230 and 232 may be maintained at a minimum voltage of approximately 0.45 V and does not fall substantially during portion 328 when the differential input signal remains at the same logic value for several data bits. Thus, the reference currents provided by current steering circuits 240 and 250 may provide a deterministic low voltage at diodes that are turned off.

Plot 330 illustrates a data eye 332 of single ended output signal sg12_inr_out provided by comparator 200 at node 298. As shown in plot 330, data eye 332 exhibits very little jitter and a relatively wide opening.

Figure 4:
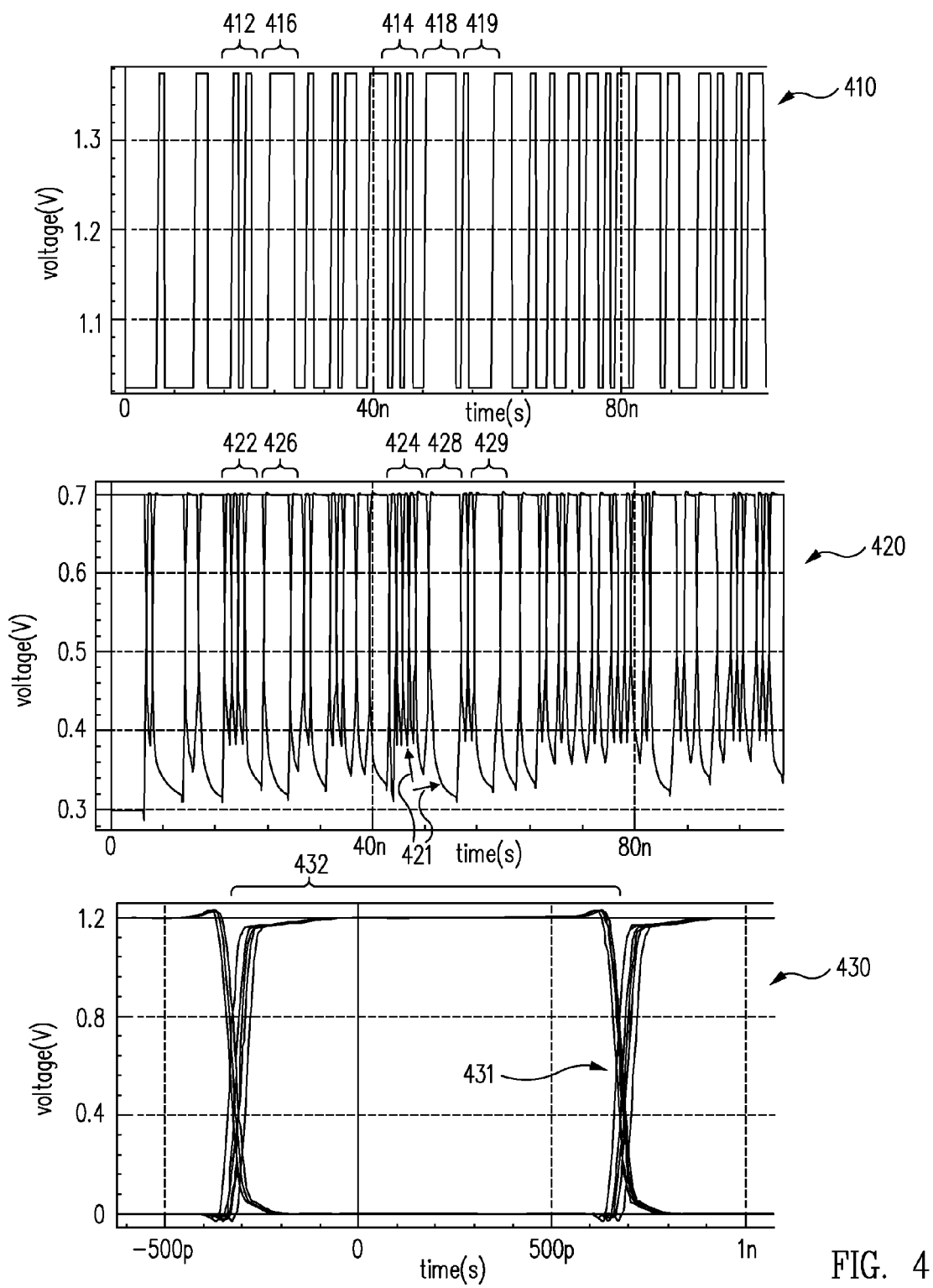
FIG. 4 illustrates signal plots associated with a conventional comparator.

These various advantages may be further appreciated upon comparison of FIG. 3 with FIG. 4. FIG. 4 illustrates signal plots 410, 420, and 430 associated with a conventional comparator that lacks current steering circuits 240 and 250 and does not provide reference currents (e.g., bleed currents) to diodes that are turned off.

Plot 410 illustrates substantially the same differential input signal as shown in plot 310 of FIG. 3. Accordingly, plot 410 exhibits portions where the differential input signal rapidly alternates between logic high and logic low values (e.g., see portions 412 and 414), and also exhibits portions where the differential input signal remains at the same logic value (e.g., see portions 416, 418, and 419).

Plot 420 illustrates the resulting voltages provided to diodes of the conventional comparator in response to the differential input signal of plot 410. As shown in plot 420, the resulting voltages for diodes in an off state are inconsistent and vary in this example over a range from approximately 0.3 V to approximately 0.4 V. In particular, when alternating logic high and logic low values are provided by the differential input signal, diode voltages in the off state remain close to 0.4 V (e.g., see portions 422 and 424). However, when the differential input signal remains at the same logic value, diode voltages in the off state are permitted to fall close to 0.3 V (e.g., see portions 426, 428, and 429). This disparity is further indicated by arrows 421.

Thus, the time required for diodes of the conventional comparator to switch between off and on states may be inconsistent depending on the type of data pattern (e.g., alternating or constant) provided by the differential input signal of plot 410. As a result, the single ended output signal provided by the conventional comparator may exhibit significant data dependent jitter. For example, plot 430 illustrates a data eye 432 of a single ended output signal provided by the conventional comparator. It will be appreciated that data eye 432 exhibits significant jitter (e.g., duty cycle distortion) as indicated by an arrow 431.

In view of the present disclosure, it will be appreciated that comparator 200 as set forth herein allows data dependent jitter to be substantially reduced. In particular, providing appropriate reference currents by current steering circuits 240 and 250 to any of diodes 220, 222, 224, and 226 while such diodes are in an off state may reduce the voltage swing of the diodes and provide a consistent single ended output signal sg12_inr_out using comparator 200.

Embodiments described above illustrate but do not limit the invention. It should also be understood that numerous modifications and variations are possible in accordance with the principles of the invention. Accordingly, the scope of the invention is defined only by the following claims.

What is claimed is:

1. A comparator circuit comprising:
   a differential stage adapted to receive a differential input signal;
   first and second diodes coupled to the differential stage, wherein the first and second diodes are adapted to selectively switch on and off to provide a differential output signal at first and second differential output nodes in response to the differential input signal;
   a current steering circuit adapted to selectively provide a reference current from a current source to the first or second diode in an off state to reduce a voltage swing of the first or second diode between the off state and an on state; and
   an output stage coupled to the first and second diodes at the first and second differential output nodes, wherein the output stage is adapted to convert the differential output signal to a single ended output signal.

2. The comparator circuit of claim 1, wherein the reference current is a first reference current, the current source is a first current source, and the differential stage comprises:
   a differential pair of transistors; and
   a second current source adapted to provide a second reference current to be selectively passed by the differential pair of transistors to the first or second differential output node to selectively switch the first or second diode in response to the differential input signal.

3. The comparator circuit of claim 2, wherein the second reference current is less than the first reference current.

4. The comparator circuit of claim 2, wherein the differential pair is a first differential pair, the comparator circuit further comprises third and fourth diodes coupled to the differential stage, and the differential stage further comprises:
   a second differential pair of transistors coupled to the third and fourth diodes; and
   a third current source adapted to provide a third reference current to be selectively passed by the second differential pair of transistors to the third or the fourth diode in response to the differential input signal.

5. The comparator circuit of claim 4, wherein the third and fourth diodes are adapted to selectively switch on and off in response to the third reference current to provide a fourth reference current to the first or second differential output node.

6. The comparator circuit of claim 5, wherein the current steering circuit is a first current steering circuit, the comparator circuit further comprising a second current steering circuit adapted to selectively provide a fifth reference current from a fifth current source to the third or fourth diode in an off state to reduce a voltage swing of the third or fourth diode between the off state and an on state.

7. The comparator circuit of claim 1, wherein the current steering circuit comprises:
   the current source; and
   a differential pair of transistors adapted to selectively provide the reference current to the first or second diode in response to the differential input signal.

8. The comparator circuit of claim 1, wherein the differential stage is adapted to operate using a first reference voltage and the output stage is adapted to operate at a second reference voltage less than the first reference voltage.

9. The comparator circuit of claim 1, further comprising disable circuits adapted to selectively turn off the differential stage and a gain circuit of the output stage in response to disable signals to reduce power consumption of the comparator circuit.

10. The comparator circuit of claim 1, wherein the comparator circuit is part of a programmable logic device (PLD).

11. A method of operating a comparator circuit, the method comprising:
   receiving a differential input signal at a differential stage;
   selectively switching on and off first and second diodes coupled to the differential stage to provide a differential output signal at first and second differential output nodes in response to the differential input signal;
   selectively providing a reference current to the first or second diode in an off state to reduce a voltage swing of the first or second diode between the off state and an on state; and
   converting the differential output signal to a single ended output signal using an output stage.

12. The method of claim 11, wherein the reference current is a first reference current, the method further comprising selectively passing a second reference current by a differential pair of transistors to the first or second differential output node to selectively switch the first or second diode in response to the differential input signal.

13. The method of claim 12, wherein the second reference current is less than the first reference current.

14. The method of claim 12, wherein the differential pair is a first differential pair, the method further comprising selectively passing a third reference current by a second differential pair of transistors to a third or a fourth diode coupled to the differential stage in response to the differential input signal.

15. The method of claim 14, further comprising selectively switching on and off the third and fourth diodes in response to the third reference current to provide a fourth reference current to the first or second differential output node.

16. The method of claim 15, further comprising selectively providing a fifth reference current to the third or fourth diode in an off state to reduce a voltage swing of the third or fourth diode between the off state and an on state.

17. The method of claim 11, wherein the selectively providing a reference current comprises selectively passing the second reference current by a differential pair of transistors to the first or second diode in response to the differential input signal.

18. The method of claim 11, wherein the differential stage is adapted to operate using a first reference voltage and the output stage is adapted to operate at a second reference voltage less than the first reference voltage.

19. The method of claim 11, further comprising selectively disabling the differential stage and a gain circuit of the output stage in response to disable signals to reduce power consumption of the comparator circuit.

20. A programmable logic device (PLD) comprising:
a comparator circuit comprising:
a differential stage adapted to receive a differential input signal;
first and second diodes coupled to the differential stage, wherein the first and second diodes are adapted to selectively switch on and off to provide a differential output signal at first and second differential output nodes in response to the differential input signal;
a current steering circuit adapted to selectively provide a reference current from a current source to the first or second diode in an off state to reduce a voltage swing of the first or second diode between the off state and an on state; and
an output stage coupled to the first and second diodes at the first and second differential output nodes, wherein the output stage is adapted to convert the differential output signal to a single ended output signal.

* * * * *